United States Patent
Kobayashi

(10) Patent No.: US 6,501,125 B2
(45) Date of Patent: *Dec. 31, 2002

(54) SEMICONDUCTOR DEVICE AND MANUFACTURING METHOD THEREOF

(75) Inventor: Kiyoteru Kobayashi, Tokyo (JP)

(73) Assignee: Mitsubishi Denki Kabushiki Kaisha, Tokyo (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/504,588

(22) Filed: Feb. 15, 2000

(65) Prior Publication Data

US 2002/0070407 A1 Jun. 13, 2002

(30) Foreign Application Priority Data

Jul. 23, 1999 (JP) .......................... 11-209583

(51) Int. Cl.$^7$ ............................. H01L 29/788
(52) U.S. Cl. ............... 257/317; 257/314; 257/315; 257/316
(58) Field of Search ............ 257/314, 317, 257/324, 316, 315

(56) References Cited

U.S. PATENT DOCUMENTS

| | | | | |
|---|---|---|---|---|
| 5,254,870 A | * | 10/1993 | Kimura | 257/659 |
| 5,440,158 A | * | 8/1995 | Sung-Mu | 257/314 |
| 5,497,018 A | * | 3/1996 | Kajita | 257/315 |
| 5,614,746 A | * | 3/1997 | Hong et al. | 257/316 |
| 6,133,602 A | * | 10/2000 | Shrivastava et al. | 257/314 |
| 6,136,648 A | * | 10/2000 | Oya | 438/257 |
| 6,137,156 A | * | 10/2000 | Ichikawa | 257/640 |
| 6,204,122 B1 | * | 3/2001 | Joo et al. | 438/257 |
| 6,218,710 B1 | * | 4/2001 | Koh | 257/382 |
| 6,323,085 B1 | * | 11/2001 | Sandhu et al. | 438/201 |
| 6,326,263 B1 | * | 12/2001 | Hsieh | 257/316 |
| 6,335,254 B1 | * | 1/2002 | Trivedi | 257/412 |

FOREIGN PATENT DOCUMENTS

| | | | |
|---|---|---|---|
| EP | 0322161 A2 | * | 6/1989 |
| JP | 59-3976 | | 1/1984 |
| JP | 61-61469 | | 3/1986 |
| JP | 7-106442 | | 4/1995 |

OTHER PUBLICATIONS

"A Low Voltage Operating Flash Memory Cell with High Coupling Ratio Using Horned Floating Gate with Fine HSG", T. Kitamura et al., 1998 Symposium on VLSI Technology Digest of Technical Papers, pp. 104–105.

* cited by examiner

Primary Examiner—Olik Chaudhuri
Assistant Examiner—Nathan W. Ha
(74) Attorney, Agent, or Firm—McDermott, Will & Emery

(57) ABSTRACT

A semiconductor device and its manufacturing method which not only can solve the problem that a memory cell size determines a write/erase speed of memory cell transistors but also can increase the write/erase speed while preventing the reduction in the reliability of an insulating film between a control gate and a second-layer floating gate. Since the insulating film under a second-layer floating gate has irregularity, the second-layer floating gate itself has irregularity, whereby its surface area and hence the write/erase speed is increased. Further, since the insulating film under the second-layer floating gate has irregularity, protrusions on the surface of the second-layer floating gate are rounded. Therefore, the degree of electric field concentration is reduced, whereby the reliability of the insulating film between the control gate and the second-layer floating gate is prevented from being lowered.

5 Claims, 13 Drawing Sheets

*F i g .  2 6* (PRIOR ART)
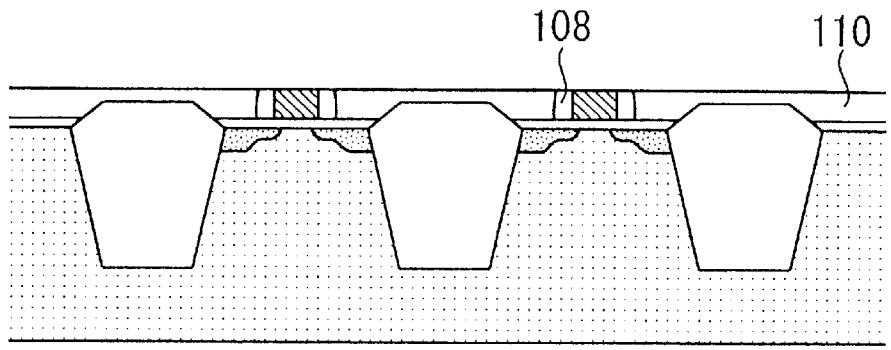
*F i g .  2 7* (PRIOR ART)
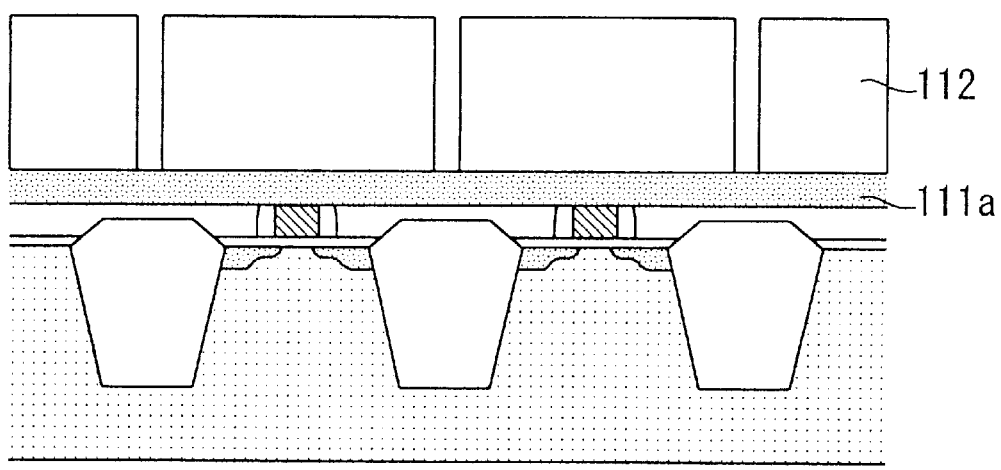
*F i g .  2 8* (PRIOR ART)
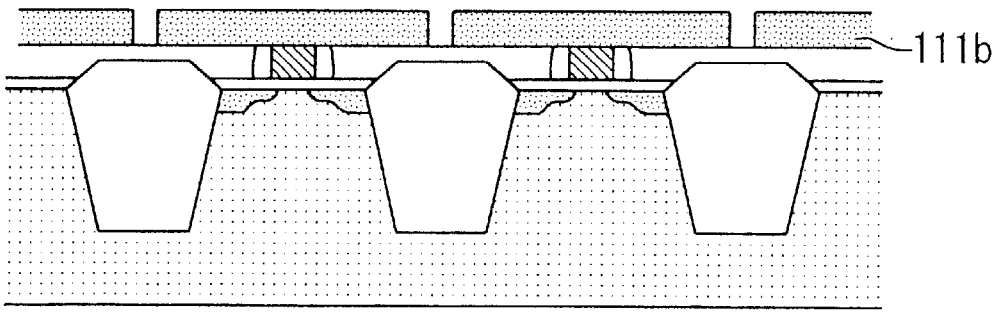

SEMICONDUCTOR DEVICE AND MANUFACTURING METHOD THEREOF

BACKGROUND OF THE INVENTION

1. Field of the Invention

The present invention relates to a semiconductor storage device and its manufacturing method and, particularly, to a nonvolatile semiconductor storage device and its manufacturing method.

2. Description of Related Art

FIGS. 17–30 show a process for forming a memory cell portion of a conventional semiconductor device, particularly a nonvolatile semiconductor storage device.

As shown in FIGS. 17 and 18, device isolation regions 102 are formed on the main surface of a p-type silicon substrate 101.

As shown in FIG. 19, after the main surface of the p-type silicon substrate 101 is cleaned, a tunnel oxide film 103 of about 100 Å in thickness is formed by thermal oxidation in areas other than above the device isolation regions 102. A phosphorus-doped polysilicon film 104a of about 1,000 Å in thickness is formed on the surface of the tunnel oxide film 103 by low-pressure CVD, and then a silicon nitride film 105a of about 1,000 Å in thickness is deposited on the phosphorus-doped polysilicon film 104a.

Then, as shown in FIG. 20, after a resist (not shown) is formed in a desired pattern on the silicon nitride film 105a by photolithography, first-layer floating gates 104b are formed by etching the phosphorus-doped polysilicon film 104a and the silicon nitride film 105a by using the resist as a mask. Silicon nitride films 105b are formed on the respective first-layer floating gates 104b. After the resist is removed, n⁻ regions (diffusion regions) 106 are formed by implanting phosphorus ions at energy of 50 eV at a dose of $2 \times 10^{13}$ cm$^{-2}$.

Then, as shown in FIG. 21, a thick silicon oxide film 107 of about 2,000 Å in thickness is deposited by low-pressure CVD.

Then, as shown in FIG. 22, sidewalls 108 of silicon oxide films are formed on the first-layer floating gates 104b by anisotropic etching. Then, annealing is performed at about 900° C. in a nitrogen atmosphere. Then, n⁺ regions (diffusion regions) 109 are formed under the tunnel insulating film 103 by implanting arsenic ions at energy of 50 eV at a dose of $5 \times 10^{15}$ cm$^{-2}$.

Then, as shown in FIG. 23, a thick silicon oxide film 110 of about 4000 Å in thickness is deposited by CVD.

Then, as shown in FIG. 24, the silicon nitride films 105b on the respective first-layer floating gates 104b are exposed by etching back the silicon oxide film 110 by dry etching.

Then, as shown in FIG. 25, the silicon nitride films 105b on the respective first-layer floating gates 104b are removed by using a heated phosphoric acid.

Then, as shown in FIG. 26, the silicon oxide film 110 and the sidewalls 108 are etched back by dry etching.

Then, as shown in FIG. 27, a phosphorus-doped polysilicon film 111a of about 1,000 Å in thickness is deposited on the etched-back silicon oxide film 110 and sidewalls 108 by low-pressure CVD. Then, a resist 112 is formed in a desired pattern on the phosphorus-doped polysilicon film 111a by photolithography.

Then, as shown in FIG. 28, second-layer floating gates 111b are formed by etching the phosphorus-doped polysilicon film 111a by using the resist 112 as a mask.

Subsequently, as shown in FIG. 29, a silicon oxide film 113 of about 200 Å in thickness is deposited on the second-layer floating gates 111b and the silicon oxide film 110 by low-pressure CVD.

As shown in FIG. 30, a phosphorus-doped polysilicon film 114 is deposited on the silicon oxide film 113 and then a silicon oxide film 115 is formed on the phosphorus-doped polysilicon film 114. After a resist is patterned by photolithography, the silicon oxide film 115 and the phosphorus-doped polysilicon film 114 are patterned. The resist is then removed. Then, after a resist is formed in a peripheral circuit portion by photolithography, floating gate electrodes 111c of memory transistors are formed from the phosphorus-doped polysilicon films 111b and etched first-layer floating gates 104c are formed by etching the silicon insulating film 113, the phosphorus-doped polysilicon film 111b, and the first-layer floating gates 104b by using the silicon oxide film 115 in the memory cell portion as a mask.

Subsequently, n-channel transistors and p-channel transistors are formed in the peripheral circuit portion.

Then, a boron-phosphorus glass layer 121 of about 10,000 Å is deposited on the silicon oxide film 115 by CVD. After the boron-phosphorus glass layer 121 is burnt and tightened by performing a heat treatment at about 850° C. for about 30 minutes in a nitrogen atmosphere, a resist (not shown) is formed in a desired pattern on the boron-phosphorus glass layer 121 by photolithography. After contact holes are formed by etching the boron-phosphorus glass layer 121 using the resist as a mask, an aluminum-silicon-copper (Al—Si—Cu) alloy film 122 is deposited by sputtering. Then, after a resist (not shown) is formed in a desired pattern by photolithography, an Al—Si—Cu wiring 122 is formed by etching the Al—Si—Cu alloy film 122 by using the resist as a mask.

In the above conventional nonvolatile semiconductor device, information (data) is stored in the memory cell transistors depending on whether electrons are injected in or released from the first-layer floating gates 104c and the second-layer floating gates 111c. In a state that electrons are injected in the first-layer floating gate 104c and the second-layer floating gate 111c, the threshold voltage of a memory cell transistor has a large value Vthp. This state is called a programmed state. In this case, data "0" is stored in the memory cell transistor. Since electrons accumulated in the first-layer floating gate 104c and the second-layer floating gate 111c do not disappear semi-permanently as long as they are left as they are, the stored data is also held semi-permanently.

In a state that electrons are released from the first-layer floating gate 104c and the second-layer floating gate 111c, the threshold voltage of a memory cell, transistor has a small value Vthe. This state is called an erased state. In this case, data "1" is stored in the memory cell transistor. Data "0" or "1" that is stored in a memory cell transistor can be read out by detecting one of the programmed state and the erased state. Certain stored data may be defined as either "0" or "1"; it is also possible to make a definition that data "1" is stored in the programmed state and data "0" is stored in the erased state.

In the programmed state, a high voltage Vpp (usually about 20 V) is applied to the control gate 114 and the n-type diffusion layer 109a and the silicon substrate 101 are grounded. Because of the grounding, electrons are generated in the channel that is formed between the n-type diffusion layers 109a and 109b. The electrons generated in the channel tunnel through the energy barrier of the tunnel insulating film 103 and are injected into the first-layer floating gate 104c and the second-layer floating gate 111c. As a result, the threshold voltage of the memory cell transistor increases to the large value Vthp.

At the time of erasing, a high voltage −Vpp (usually about −20 V) is applied to the control gate 114 and the n-type diffusion layer 109a and the silicon substrate 101 are grounded. Because of the grounding, electrons are released from the first-layer floating gate 104c and the second-layer floating gate 111c to the silicon substrate 101 by the tunneling phenomenon. As a result, the threshold voltage of the memory cell transistor decreases to the small value Vthe.

Each memory cell of the above conventional nonvolatile semiconductor storage device consists of a capacitor C1 that is composed of the control gate 114, the silicon oxide film 113, the second-layer floating gate 111c, and the first-layer floating gate 104c and a capacitor C2 that is composed of the second-layer floating gate 111c, the first-layer floating gate 104c, the tunnel oxide film 103, and the silicon substrate 101. The capacitances of the capaacitors C1 and C2 are represented by C11 and C22, respectively. When the voltage Vpp is applied to the control gate 114, the potential difference between the second-layer floating gate 111c/first-layer floating gate 104c and the silicon substrate 101, that is, the potential difference between both ends of the tunnel oxide film 103, increases and the electron tunneling probability increases as the capacitance C11 becomes larger. The increased electron tunneling probability increases the write/erase speed.

The capacitance C11 is in proportion to the surface area of the second-layer floating gate 111c. In the conventional nonvolatile semiconductor storage device, the surface area of the second-layer floating gate 111c is restricted by the memory cell size. This causes a problem that as the memory cells are miniaturized, the capacitance C11 decreases and the write/erase speed of the memory cell transistors lowers.

To solve the problem that the write/erase speed of the memory cell transistors lowers, another conventional nonvolatile semiconductor storage device (e.g., one disclosed in Japanese Patent Laid-Open No. 7-106442) employs the following measure. That is, to increase the write/erase speed of the memory cell transistors, the surface area of the second-layer floating gate 111c is increased by forming irregularity, that is, many minute spherical crystals, on the surface of the second-layer floating gate 111c.

However, the above conventional measure that is taken to increase the write/erase speed of the memory cell transistors results in a problem that electric fields are concentrated on the protrusions on the surface of the second-layer floating gate 111c and the reliability of the silicon oxide film 113 that is the insulating film located between the control gate 114 and the second-layer floating gate 111c is thereby lowered, whereby the storage device is rendered not suitable for practical use.

SUMMARY OF THE INVENTION

The present invention has been made to solve the above problems in the art, and an object of the invention is therefore to provide a semiconductor device and its manufacturing method which not only can solve the problem that the memory cell size determines the write/erase speed of the memory cell transistors but also can increase the write/erase speed while preventing the reduction in the reliability of the insulating film between the control gate 114 and the second-layer floating gate 111c.

According to a first aspect of the present invention, there is provided a semiconductor device comprising: a semiconductor substrate having a first conductivity type; device isolation regions formed on a main surface of the semiconductor substrate; a tunnel insulating film formed on the main surface of the semiconductor substrate except for the device isolation regions; a first-layer floating gate formed on the tunnel insulating film; diffusion regions having a second conductivity type formed at both ends of the first-layer floating gate; an insulating film having irregularity formed over the diffusion regions having the second conductivity type and the device isolation regions; a second-layer floating gate having irregularity formed on the insulating film; and a control gate formed on the second-layer floating gate, wherein the insulating film formed under the second-layer floating gate and on the first-layer floating gate and the insulating film formed on the device isolation regions, respectively, have raised portions.

According to a second aspect of the present invention, there is provided a manufacturing method of a semiconductor device, comprising the steps of: forming device isolation regions on a main surface of a semiconductor substrate having a first conductivity type; forming a tunnel insulating film on the main surface of the semiconductor substrate except for the device isolation regions; forming a first-layer floating gate on the tunnel insulating film; forming diffusion regions having a second conductivity type at both ends of the first-layer floating gate; forming an insulating film having irregularity over the diffusion regions and the device isolation regions; forming a second-layer floating gate having irregularity on the insulating film; and forming a control gate on the second-layer floating gate, wherein the insulating film located under the second-layer floating gate and on the diffusion regions having a second conductivity type and the insulating film on the device isolation regions, respectively, are formed to be convex.

According to a third aspect of the present invention, there is provided a semiconductor device comprising: a semiconductor substrate having a first conductivity type; device isolation regions formed on a main surface of the semiconductor substrate; a tunnel insulating film formed on the main surface of the semiconductor substrate except for the device isolation regions; a first-layer floating gate formed on the tunnel insulating film; diffusion regions having a second conductivity type formed at both ends of the first-layer floating gate; an insulating film formed over the diffusion regions having a second conductivity type and the device isolation regions; island-like $Si_3N_4$ portions formed on the insulating film; a second-layer floating gate having a roughened shape and formed on the $Si_3N_4$ portions; and a control gate formed on the second-layer floating gate.

The above and other objects, effects, features and advantages of the present invention will become more apparent from the following description of the embodiments thereof taken in conjunction with the accompanying drawings.

BRIEF DESCRIPTION OF THE DRAWINGS

FIGS. 1–15 show a process for forming a memory cell portion of a semiconductor device, particularly a nonvolatile semiconductor storage device, according to a embodiment 1 of the invention.

FIGS. 1 and 2 show device isolation regions 102 formed on the main surface of a p-type silicon substrate (semiconductor substrate) 101.

FIG. 3 shows a tunnel oxide film 103 of about 100 Å in thickness formed by thermal oxidation in areas other than above the device isolation regions 102.

FIG. 4 shows a first-layer floating gates 104b and silicon nitride films 105b (on the first-layer floating gates 104b)

formed by etching the phosphorus-doped polysilicon film 104a and the silicon nitride film 105a by using the resist as a mask.

Figure 5:
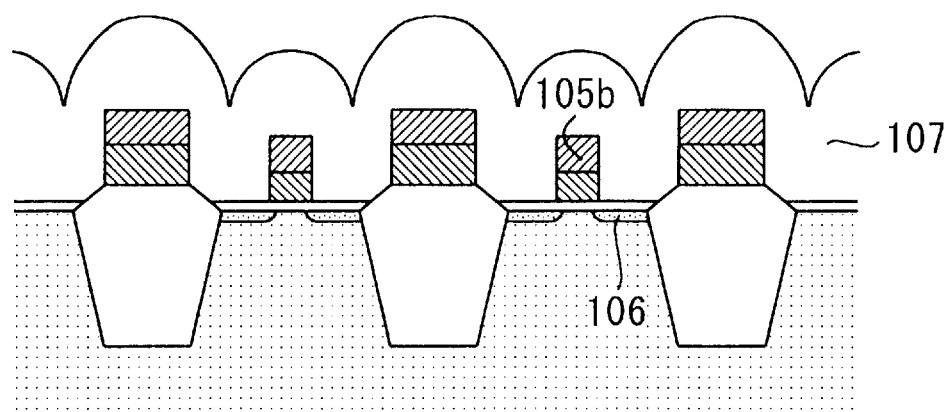

FIG. 5 shows a thick silicon oxide film 107 of about 2000 Å in thickness deposited by low-pressure CVD.

Figure 6:
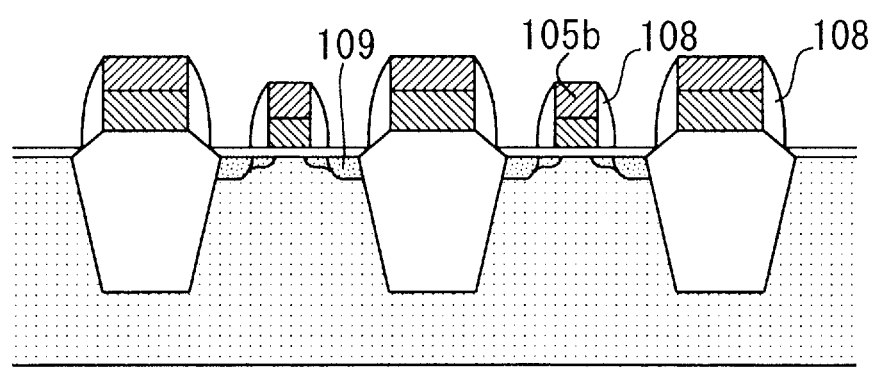

FIG. 6 shows sidewalls 108 of silicon oxide films formed on the first-layer floating gates 104b and the silicon nitride films 105c above the respective device isolation regions 102 by anisotropic etching.

Figure 7:
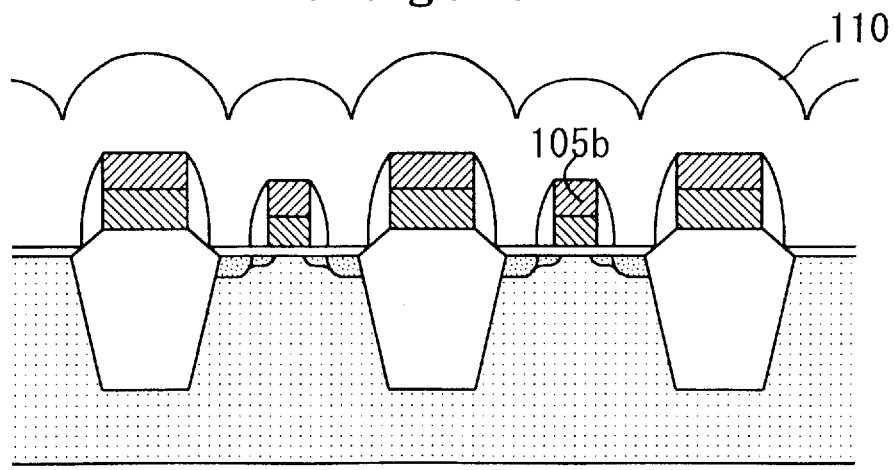

FIG. 7 shows a thick silicon oxide film 110 of about 4000 Å in thickness deposited by CVD.

Figure 8:
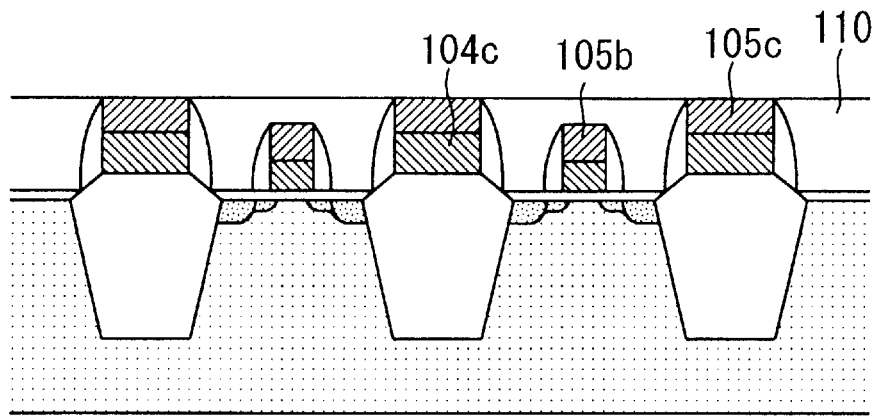

FIG. 8 shows the silicon nitride films 105c on the respective device isolation regions 102 exposed by etching back the silicon oxide film 110 by dry etching.

Figure 9:
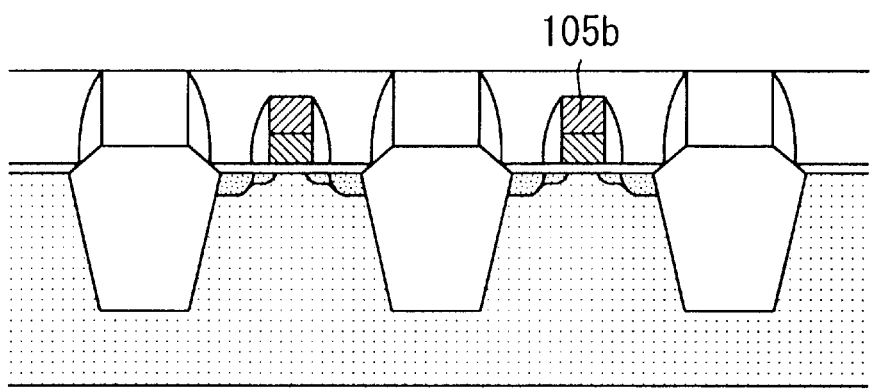

FIG. 9 shows the silicon nitride films 105c and the phosphorus-doped polysilicon films 104c on the respective device isolation regions 102 removed by using a heated phosphoric acid.

Figure 10:
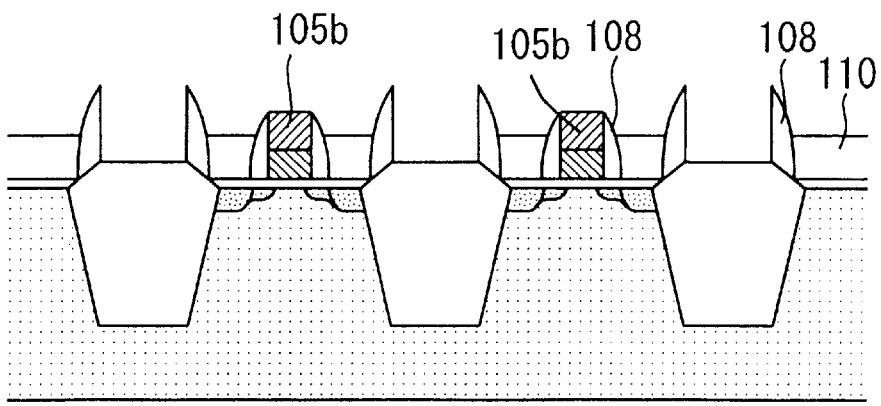
Figure 1:
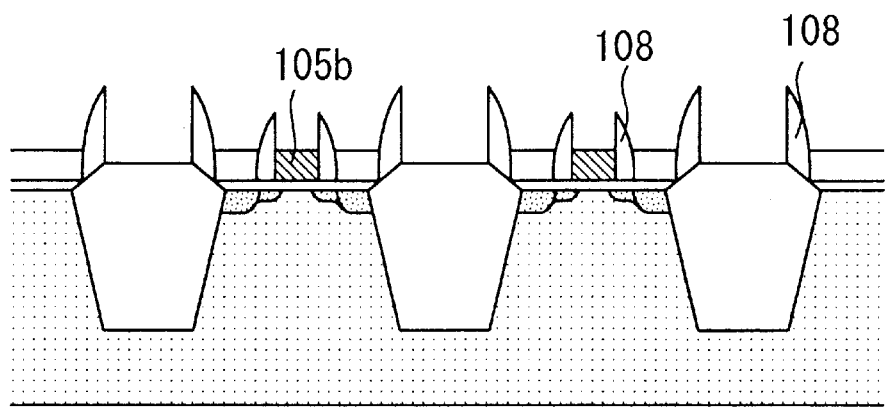
Figure 1:
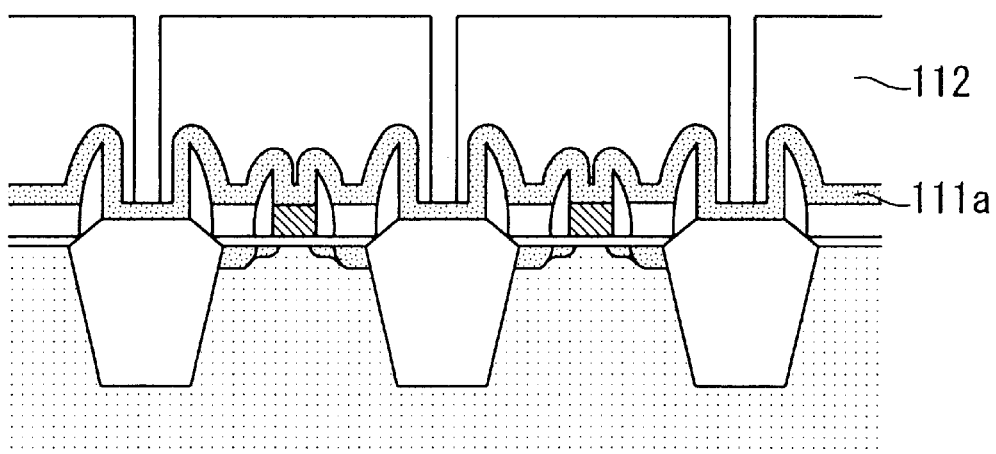
Figure 1:
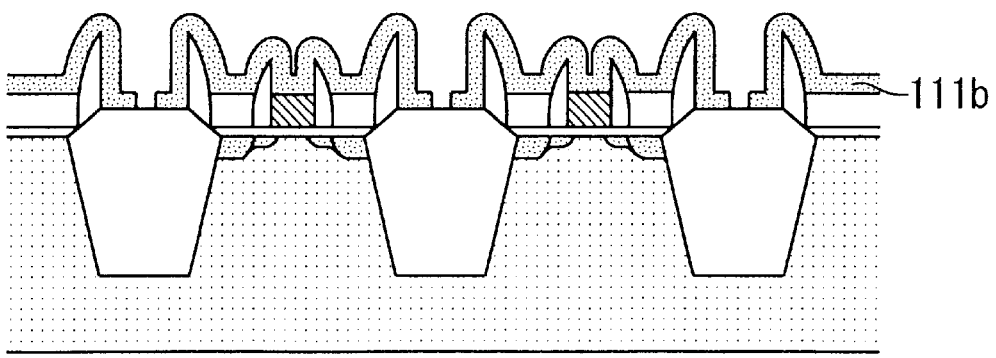

FIG. 10 shows the silicon oxide film 110 etched back by dry etching (with an HF solution).

FIG. 11 shows the silicon nitride films 105b removed by using a heated phosphoric acid.

FIG. 12 shows a phosphorus-doped polysilicon film 111a of about 1,000 Å in thickness deposited on the insulating film consisting of the sidewalls 108 etc. and having irregularity by low-pressure CVD.

FIG. 13 shows second-layer floating gates 111b formed by etching the phosphorus-doped polysilicon film 111a by using the resist 112 as a mask.

Figure 14:
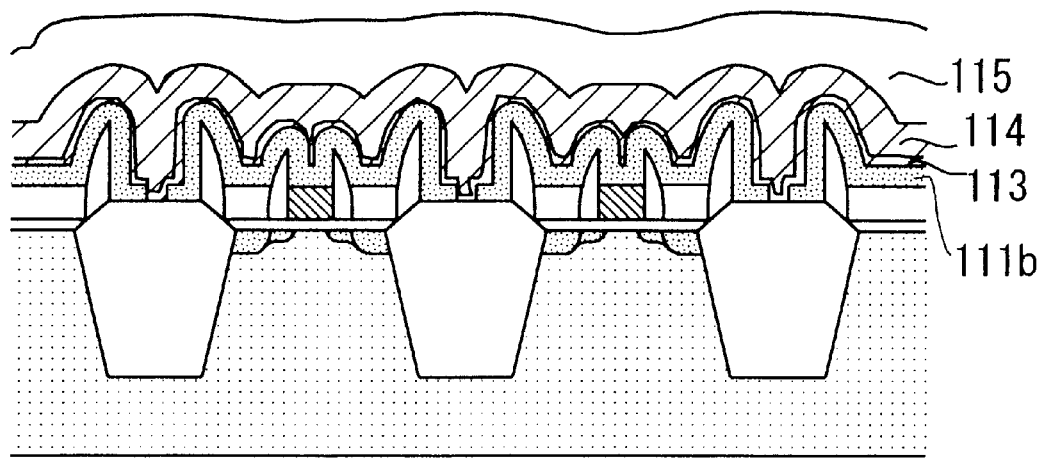

FIG. 14 shows a silicon oxide film 113 of about 200 Å in thickness deposited on the second-layer floating gates 111b and the silicon oxide film 110 by low-pressure CVD.

Figure 15:
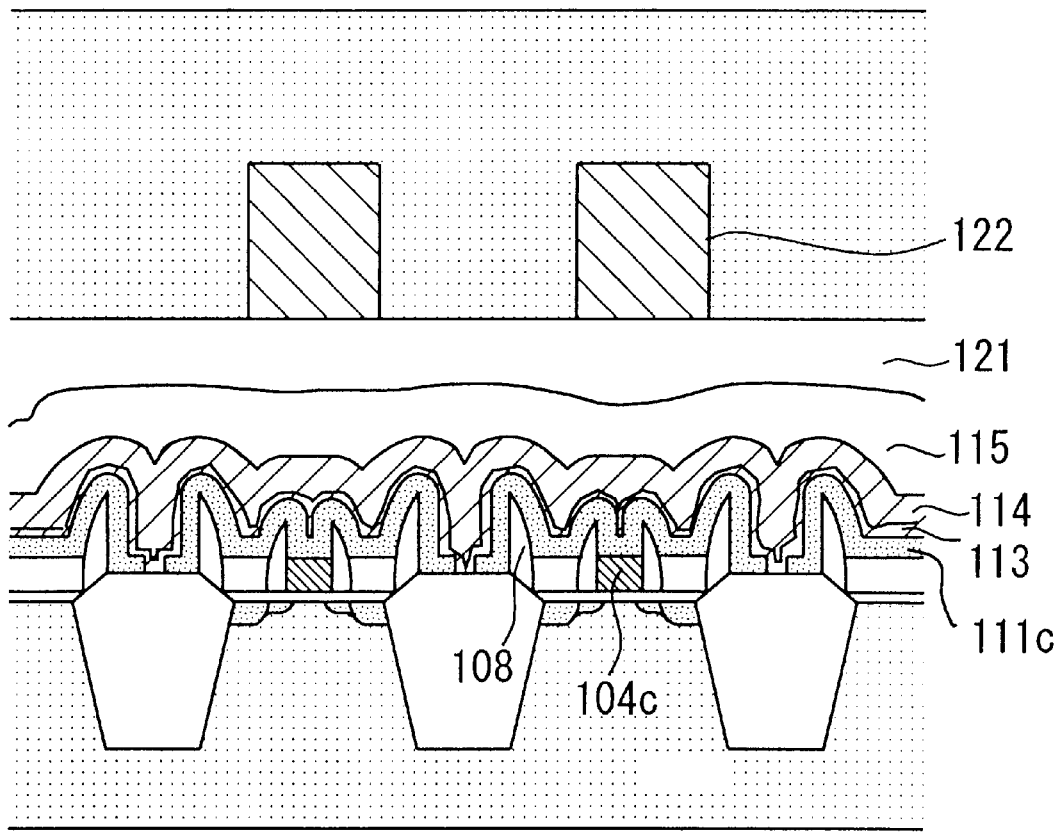

FIG. 15 shows that the silicon oxide film 115 and control gates comprising the phosphorus-doped polysilicon film 114 are patterned.

Figure 16:
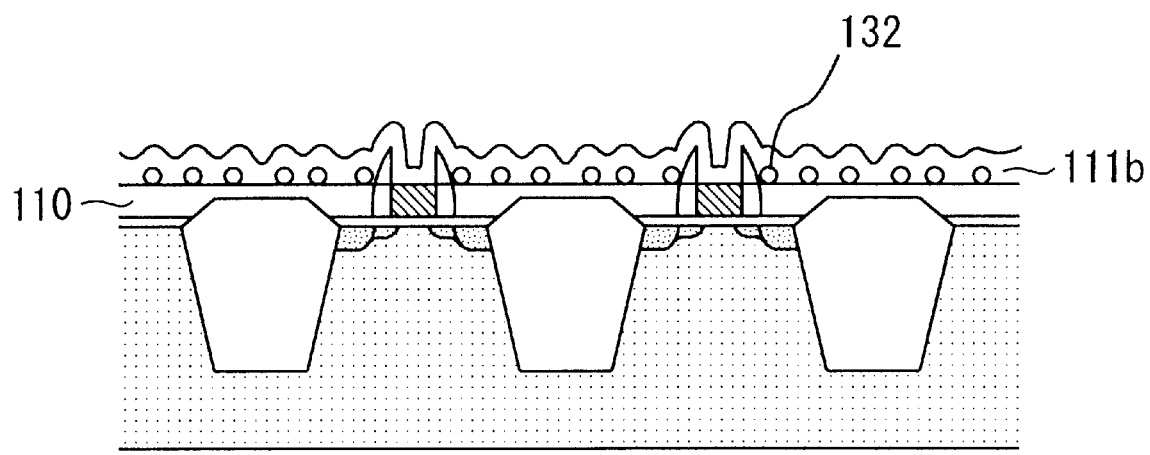

FIG. 16 shows part of a process for forming a memory cell portion of a semiconductor device, particularly a nonvolatile semiconductor storage device, according to a embodiment 2 of the invention.

FIGS. 17–30 show a process for forming a memory cell portion of a conventional semiconductor device, particularly a nonvolatile semiconductor storage device.

Figure 17:
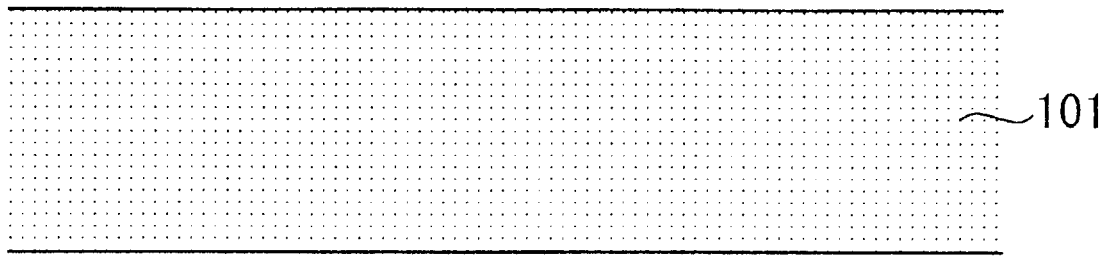
Figure 18:
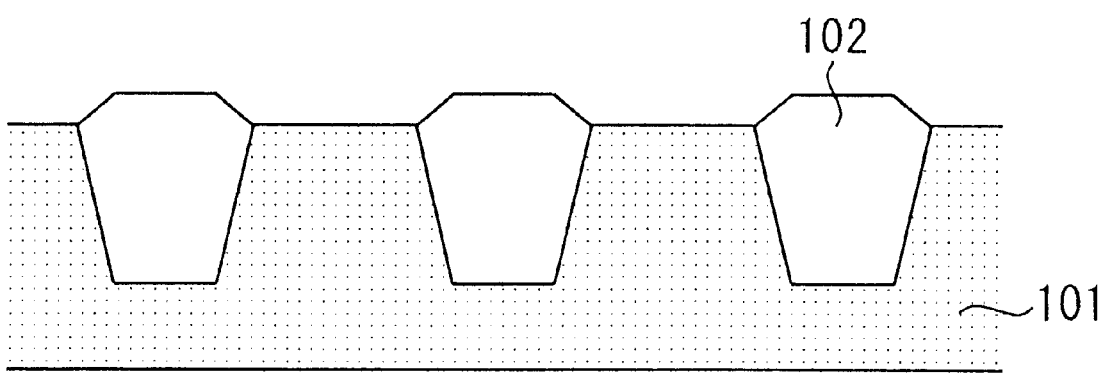

FIGS. 17 and 18 show device isolation regions 102 formed on the main surface of a p-type silicon substrate 101.

Figure 19:
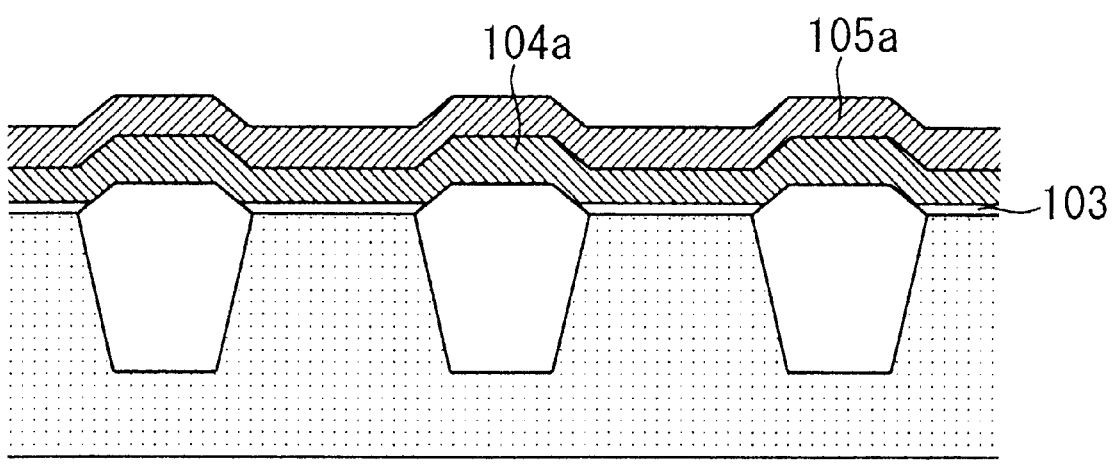

FIG. 19 shows a tunnel oxide film 103 of about 100 Å in thickness formed by thermal oxidation in areas other than above the device isolation regions 102.

Figure 20:
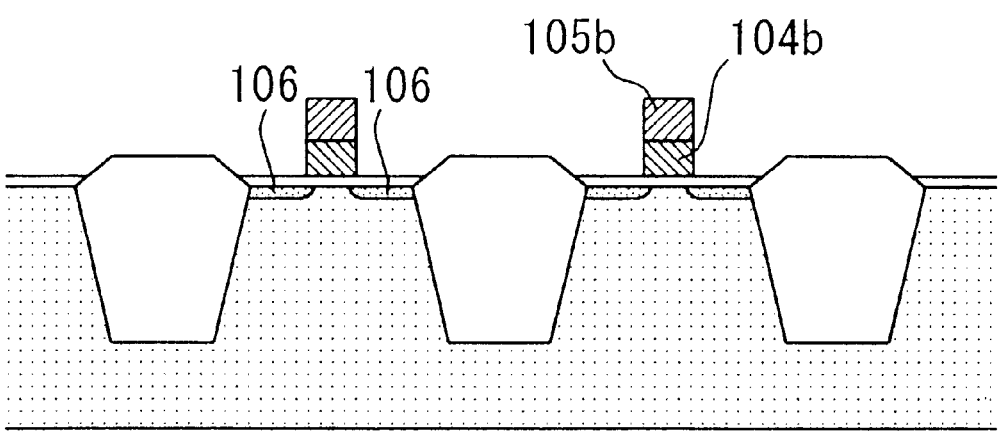

FIG. 20 shows first-layer floating gates 104b formed by etching the phosphorus-doped polysilicon film 104a and the silicon nitride film 105a by using the resist as a mask.

Figure 21:
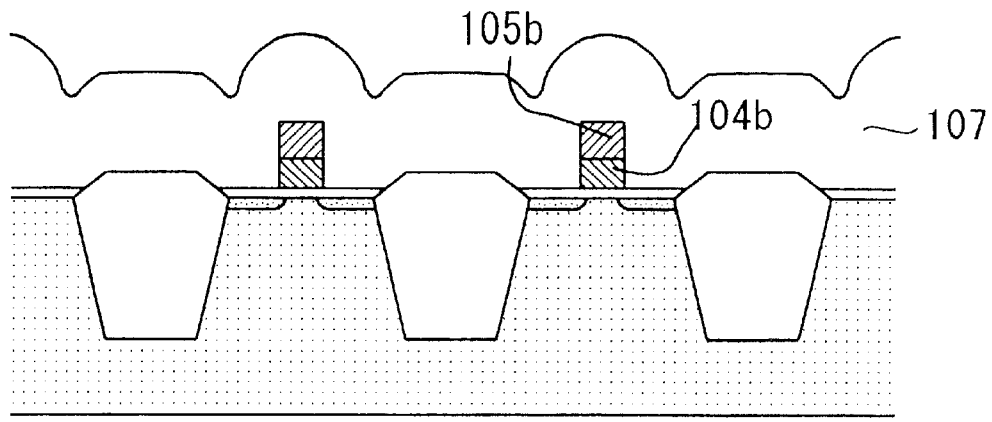

FIG. 21 shows a thick silicon oxide film 107 of about 2000 Å in thickness deposited by low-pressure CVD.

Figure 22:
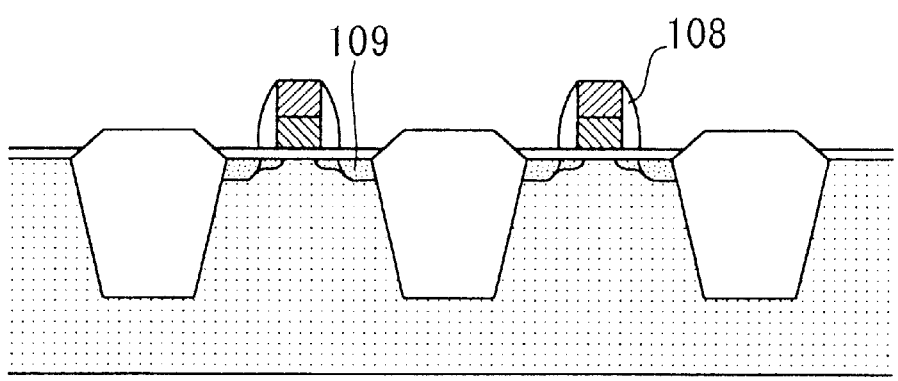

FIG. 22 shows sidewalls 108 of silicon oxide films formed on the first-layer floating gates 104b by anisotropic etching.

Figure 23:
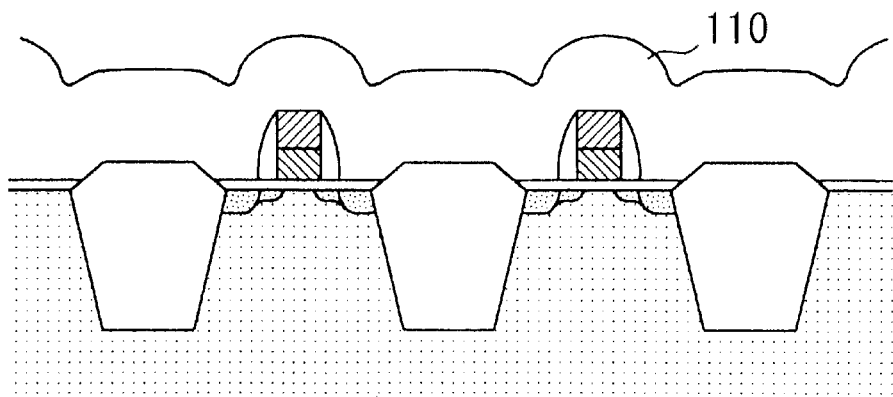

FIG. 23 shows a thick silicon oxide film 110 of about 4000 Å in thickness deposited by CVD.

Figure 24:
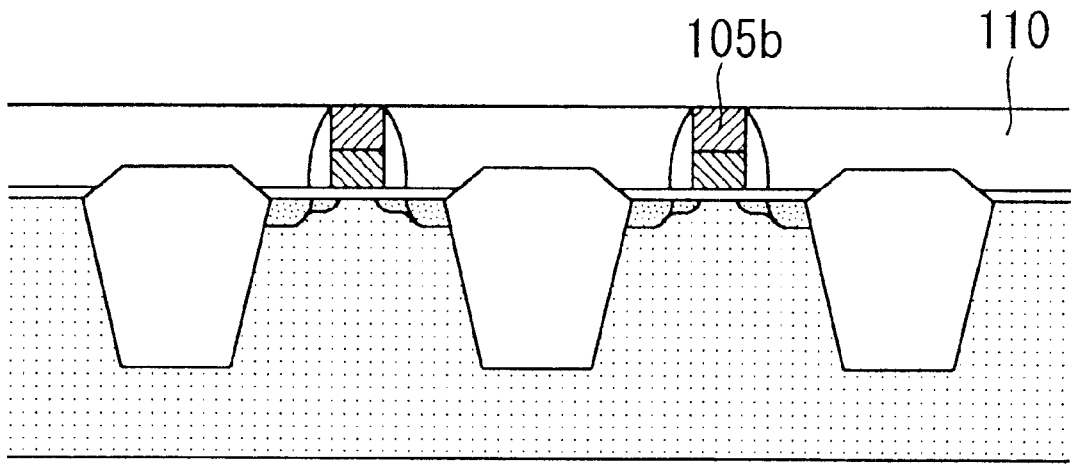

FIG. 24 shows the silicon nitride films 105b on the respective first-layer floating gates 104b exposed by etching back the silicon oxide film 110 by dry etching.

Figure 25:
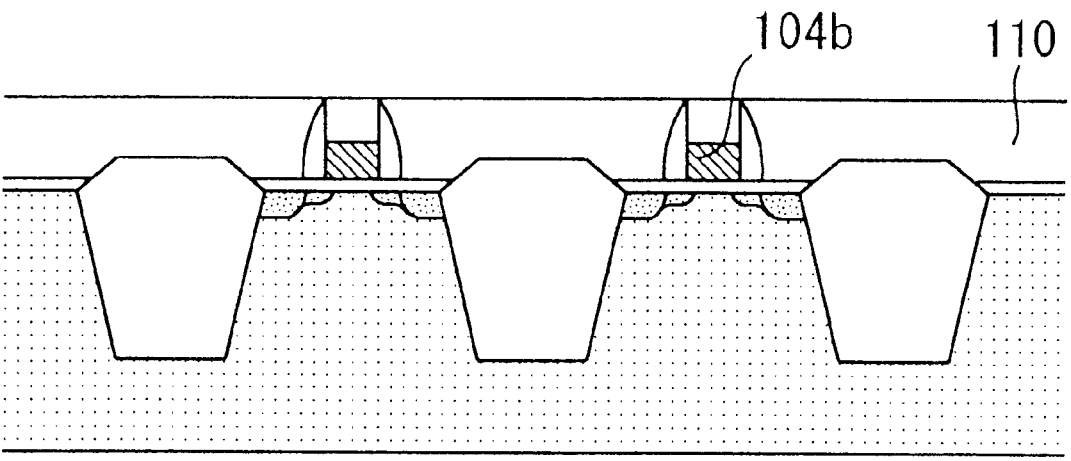

FIG. 25 shows the silicon nitride films 105b on the respective first-layer floating gates 104b removed by using a heated phosphoric acid.

FIG. 26 shows the silicon oxide film 110 and the sidewalls 108 etched back by dry etching.

FIG. 27 shows a phosphorus-doped polysilicon film 111a of about 1,000 Å in thickness deposited on the etched-back silicon oxide film 110 and sidewalls 108 by low-pressure CVD.

FIG. 28 shows second-layer floating gates 111b formed by etching the phosphorus-doped polysilicon film 111a by using the resist 112 as a mask.

Figure 29:
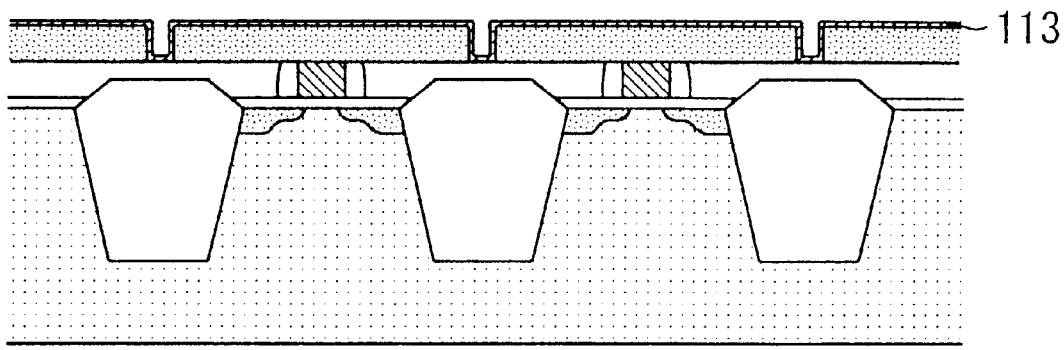

FIG. 29 shows a silicon oxide film 113 of about 200 Å in thickness deposited on the second-layer floating gates 111b and the silicon oxide film 110 by low-pressure CVD.

Figure 30:
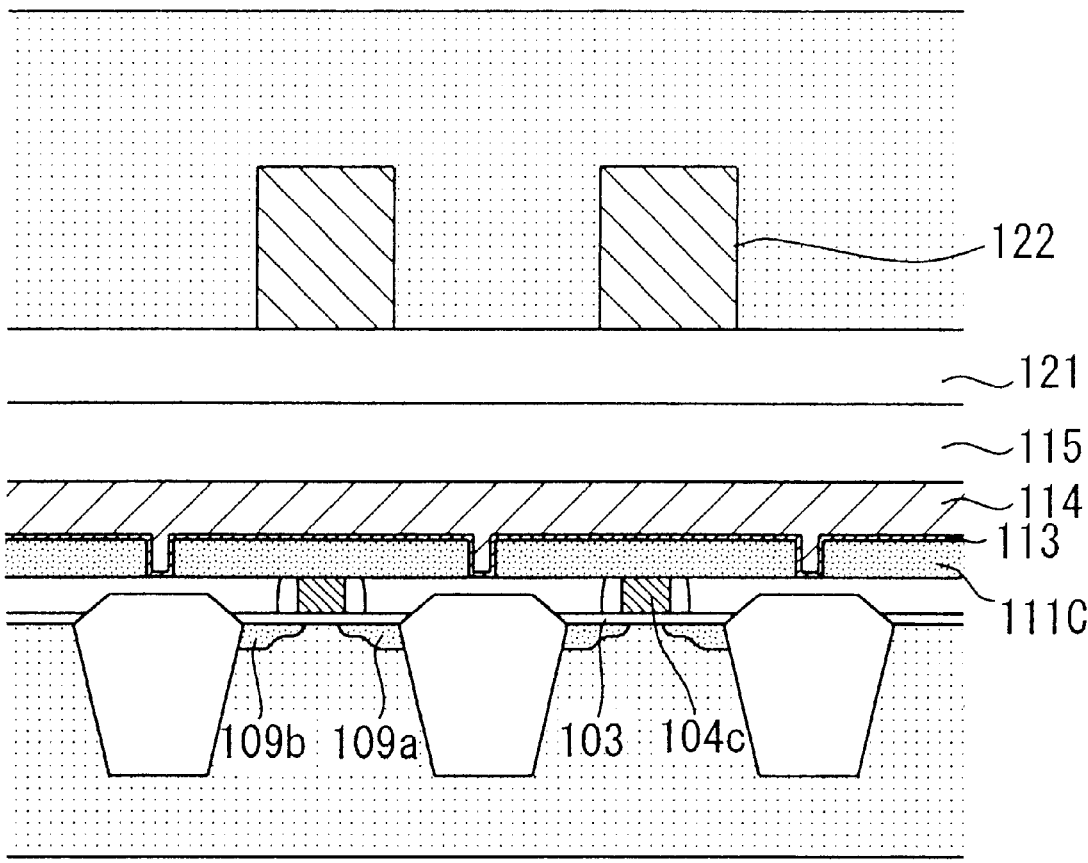

FIG. 30 shows a phosphorus-doped polysilicon film 114 deposited on the silicon oxide film 113.

DETAILED DESCRIPTION OF THE PREFERRED EMBODIMENTS

Embodiments of the present invention will be described below with reference to the accompanying drawings. It is noted that the same reference symbols in the drawings denote the same or corresponding components.
Embodiment 1

FIGS. 1–15 show a process for forming a memory cell portion of a semiconductor device, particularly a nonvolatile semiconductor storage device, according to a embodiment 1 of the invention.

Figure 1:
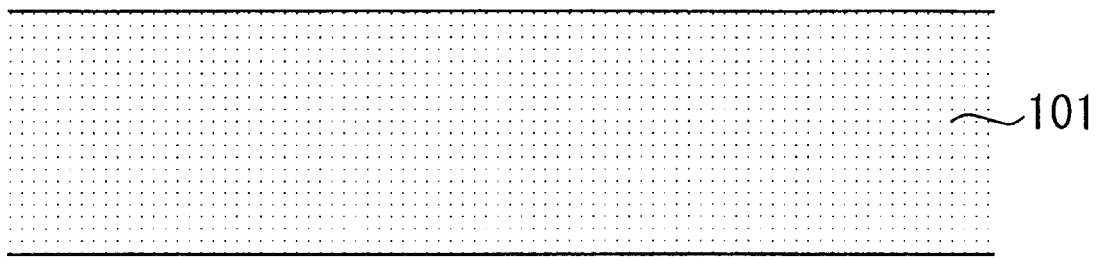
Figure 2:
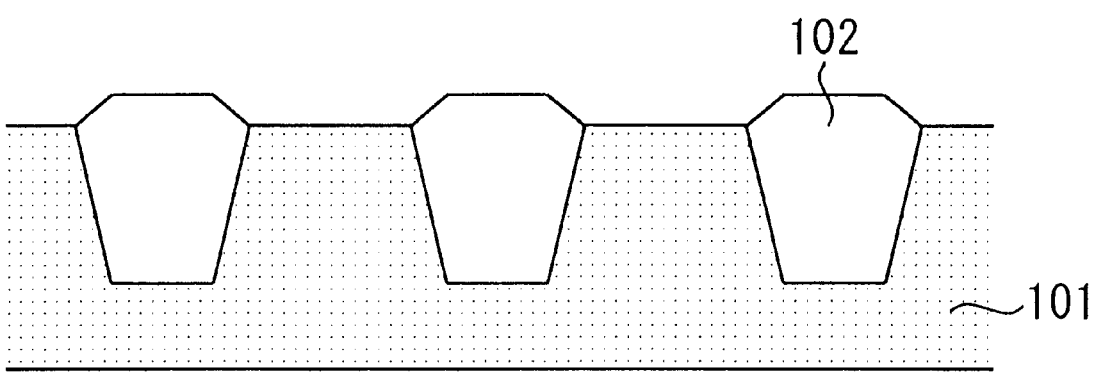

As shown in FIGS. 1 and 2, device isolation regions 102 are formed on the main surface of a p-type silicon substrate (semiconductor substrate) 101.

Figure 3:
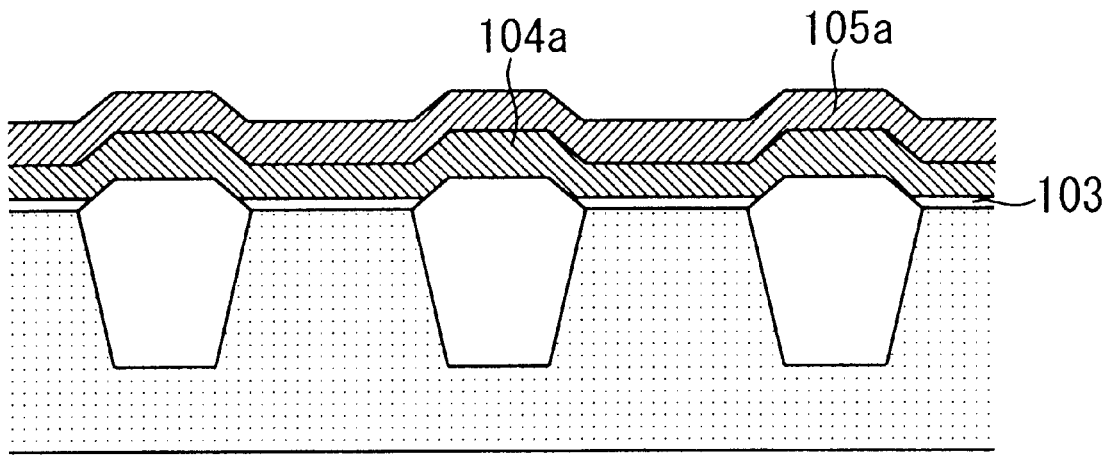

As shown in FIG. 3, after the main surface of the p-type silicon substrate 101 is cleaned, a tunnel oxide film 103 of about 100 Å in thickness is formed by thermal oxidation in areas other than above the device isolation regions 102. A phosphorus-doped polysilicon film 104a of about 1,000 Å in thickness is formed on the surface of the tunnel oxide film 103 by low-pressure CVD, and then a silicon nitride film 105a of about 1,000 Å in thickness is deposited on the phosphorus-doped polysilicon film 104a.

Figure 4:
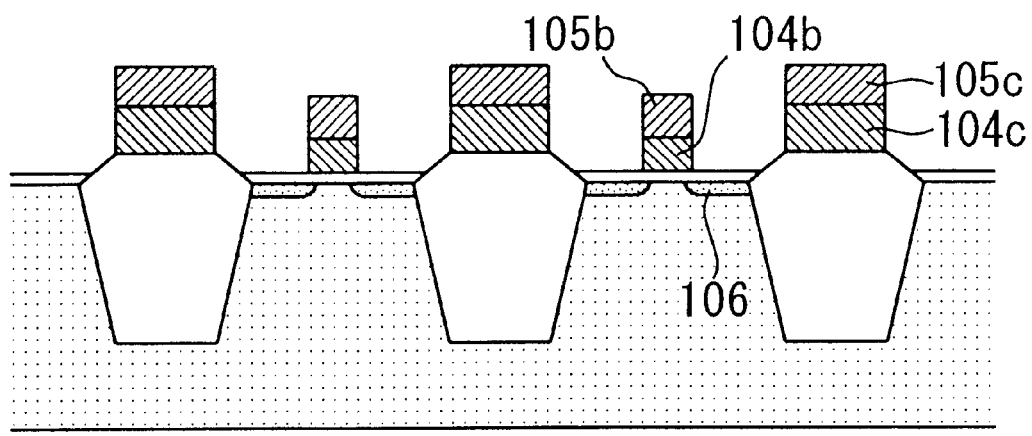

Then, as shown in FIG. 4, after a resist (not shown) is formed in a desired pattern on the silicon nitride film 105a by photolithography, first-layer floating gates 104b and silicon nitride films 105b (on the first-layer floating gates 104b) are formed by etching the phosphorus-doped polysilicon film 104a and the silicon nitride film 105a by using the resist as a mask. At the same time, phosphorus-doped polysilicon films 104c are formed on the respective device isolation regions 102 and silicon nitride films 105c are formed on the respective phosphorus-doped polysilicon films 104c. After the resist is removed, n⁻ regions (diffusion regions) 106 are formed by implanting phosphorus ions at energy of 50 eV at a dose of $2 \times 10^{13}$ cm$^{-2}$.

Then, as shown in FIG. 5, a thick silicon oxide film 107 of about 2000 Å in thickness is deposited by low-pressure CVD.

Then, as shown in FIG. 6, sidewalls 108 of silicon oxide films are formed on the first-layer floating gates 104b and the silicon nitride films 105c above the respective device isolation regions 102 by anisotropic etching. Then, annealing is performed at about 900° C. in a nitrogen atmosphere. Then, n⁺ regions (diffusion regions) 109 are formed under the tunnel insulating film 103 by implanting arsenic ions at energy of 50 eV at a dose of $5 \times 10^{15}$ cm$^{-2}$.

Then, as shown in FIG. 7, a thick silicon oxide film 110 of about 4000 Å in thickness is deposited by CVD.

Then, as shown in FIG. 8, the silicon nitride films 105c on the respective device isolation regions 102 are exposed by etching back the silicon oxide film 110 by dry etching.

Then, as shown in FIG. 9, the silicon nitride films 105c and the phosphorus-doped polysilicon films 104c on the respective device isolation regions 102 are removed by using a heated phosphoric acid.

Then, as shown in FIG. 10, the silicon oxide film 110 is etched back by dry etching (with an HF solution). At this time, protrusions as shown in FIG. 10 are formed because the sidewalls 108 were subjected to the heat treatment and hence have a small etching rate.

Then, as shown in FIG. 11, the silicon nitride films 105b are removed by using a heated phosphoric acid. As a result, an insulating film consisting of the sidewalls 108 etc. and having irregularity is formed.

Then, as shown in FIG. 12, a phosphorus-doped polysilicon film 111a of about 1,000 Å in thickness is deposited on the insulating film consisting of the sidewalls 108 etc. and having irregularity by low-pressure CVD. As a result, the phosphorus-doped polysilicon film 111a is formed so as to have irregularity. Then, a resist 112 is formed in a desired pattern on the phosphorus-doped polysilicon film 111a by photolithography.

Then, as shown in FIG. 13, second-layer floating gates 111b are formed by etching the phosphorus-doped polysilicon film 111a by using the resist 112 as a mask.

Then, as shown in FIG. 14, a silicon oxide film 113 of about 200 Å in thickness is deposited on the second-layer floating gates 111b and the silicon oxide film 110 by low-pressure CVD. Subsequently, a phosphorus-doped polysilicon film 114 is deposited on the silicon oxide film 113 and then a silicon oxide film 115 is formed on the phosphorus-doped polysilicon film 114.

Then, as shown in FIG. 15, the silicon oxide film 115 and control gates comprising the phosphorus-doped polysilicon film 114 are patterned. Then, after a resist is formed in a peripheral circuit portion by photolithography, floating gate electrodes 111c of memory transistors are formed from the phosphorus-doped polysilicon films 111b and etched first-layer floating gates 104c are formed by etching the silicon insulating film 113, the phosphorus-doped polysilicon film 111b, and the first-layer floating gates 104b by using the silicon oxide film 115 in the memory cell portion as a mask.

Subsequently, n-channel transistors and p-channel transistors are formed in the peripheral circuit portion.

Then, a boron-phosphorus glass layer 121 of about 10,000 Å is deposited on the silicon oxide film 115 by CVD. After the boron-phosphorus glass layer 121 is burnt and tightened by performing a heat treatment at about 850° C. for about 30 minutes in a nitrogen atmosphere, a resist (not shown) is formed in a desired pattern on the boron-phosphorus glass layer 121 by photolithography. After contact holes are formed by etching the boron-phosphorus glass layer 121 using the resist as a mask, an aluminum-silicon-copper (Al—Si—Cu) alloy film 122 is deposited by sputtering. Then, after a resist (not shown) is formed in a desired pattern by photolithography, an Al—Si—Cu wiring 122 is formed by etching the Al—Si—Cu alloy film 122 by using the resist as a mask.

Each memory cell of the above semiconductor device, particularly the nonvolatile semiconductor storage device, according to the embodiment 1 of the invention consists of a capacitor C1 that is composed of the control gate 114, the silicon oxide film 113, the second-layer floating gate 111c, and the first-layer floating gate 104c and a capacitor C2 that is composed of the second-layer floating gate 111c, the first-layer floating gate 104c, the tunnel oxide film 103, and the silicon substrate 101. The capacitances of the capacitors C1 and C2 are represented by C11 and C22, respectively. When a voltage Vpp is applied to the control gate 114, the potential difference between the second-layer floating gate 111c/first-layer floating gate 104c and the silicon substrate 102, that is, the potential difference between both ends of the tunnel oxide film 103, increases and the electron tunneling probability increases as the capacitance C11 becomes larger. The increased electron tunneling probability increases the write/erase speed.

The capacitance C11 is in proportion to the surface area of the second-layer floating gate 111c. Since the second-layer floating gate 111c covers the irregularity, that is, the protrusions 108 etc., that are formed on the insulating film (oxide film) formed under the floating gate 111c, the floating gate 111c itself has irregularity and hence is increased in surface area. Therefore, the capacitance C11 of the capacitor C1 is made larger than in the above-described conventional case, making an improvement in solving the problem of the conventional storage device that the write/erase speed is determined by the memory size. Further, since the floating gate 111c covers the protrusions 108 that are provided in the oxide film under the floating gate 111c, the protrusions on the surface of the floating gate 111c are rounded. This is effective in decreasing the degree of electric field concentration, whereby the write/erase speed cane increased while the reliability of the insulating film between the control gate 114 and the second-layer floating gate 111c is prevented from being lowered.

As described above, according to the embodiment 1, since the insulating film under the second-layer floating gate 111c has irregularity, the second-layer floating gate 111c itself has irregularity, whereby its surface area and hence the write/erase speed is increased. Further, since the insulating film under the second-layer floating gate 111c has irregularity, the protrusions on the surface of the second-layer floating gate 111c are rounded. Therefore, the degree of electric field concentration is reduced, whereby the reliability of the insulating film between the control gate 114 and the second-layer floating gate 111c is prevented from being lowered.

Embodiment 2

FIG. 16 shows part of a process for forming a memory cell portion of a semiconductor device, particularly a nonvolatile semiconductor storage device, according to a embodiment 2 of the invention. In the embodiment 2, the part of the process that is executed before the step of FIG. 16 is reached is the same as described in the background section in connection with FIGS. 17–24 and hence is not described here.

As shown in FIG. 16, only the silicon oxide film 110 shown in FIG. 24 is etched back. Then, $Si_3N_4$ islands 132 are grown by low-pressure CVD at about 650° C. and 0.3 Torr by using $SiH_4$—$NH_3$. Second-layer floating gates 111c are formed by depositing polysilicon on the $Si_3N_4$ islands 132.

According to the embodiment 2, since the second-layer floating gate 111c is formed on the $Si_3N_4$ islands 132, the surface of the second-layer floating gate 111c itself can be roughened, whereby its surface area and hence the write/erase speed can be increased.

As described above, in the semiconductor storage device and its manufacturing method according to the invention, the second-layer floating gate 111c itself is given irregularity and its surface area is increased. Therefore, the invention can provide a semiconductor device and its manufacturing method which not only can solve the problem the write/erase speed decreases with the memory size but also can increase the write/erase speed while preventing the reduction in the reliability of the insulating film between the control gate 114 and the second-layer floating gate 111c.

In the semiconductor device, the insulating film in the convex state formed under the second-layer floating gate and on the diffusion regions having the second conductivity type may be sidewall of the first-layer floating gate.

In the semiconductor device, the insulating film in the convex state formed under the second-layer floating gate and on the device isolation regions may be formed at the same time as sidewalls of the first-layer floating gate.

In the manufacturing method, the step of forming an insulating film may form the insulating film having a convex shape as sidewalls of the first-layer floating gate.

In the manufacturing method, the step of forming an insulating film may form the insulating film having a convex shape on the device isolation regions at the same time as sidewalls of the first-layer floating gate.

The present invention has been described in detail with respect to various embodiments, and it will now be apparent from the foregoing to those skilled in the art that changes and modifications may be made without departing from the invention in its broader aspects, and it is the invention, therefore, in the appended claims to cover all such changes and modifications as fall within the true spirit of the invention.

The entire disclosure of Japanese Patent Application No. 11-209583 filed on Jul. 23, 1999 including specification, claims, drawings and summary are incorporated herein by reference in its entirety.

What is claimed is:

1. A semiconductor device comprising:

a semiconductor substrate having a first conductivity type;

device isolation regions formed on a main surface of said semiconductor substrate;

a tunnel insulating film formed on the main surface of said semiconductor substrate except for said device isolation regions;

a first-layer floating gate formed on said tunnel insulating film;

diffusion regions having a second conductivity type formed on the main surface of said semiconductor substrate and at both ends of said first-layer floating gate;

an insulating film having a first raised irregularity formed over said diffusion regions having the second conductivity type and a second raised irregularity formed over said device isolation regions;

a second-layer floating gate formed on said insulating film; and a control gate formed on said second-layer floating gate, wherein: the insulating film is formed under said second-layer floating gate and on side surfaces of said first-layer floating gate and the insulating film is formed on said device isolation regions, respectively, have raised protrusions.

2. The semiconductor device according to claim 1, wherein the insulating film in the convex state formed under said second-layer floating gate and on said diffusion regions having the second conductivity type is sidewall of said first-layer floating gate.

3. The semiconductor device according to claim 1, wherein the first raised irregularity of said insulating film extends to a first height above the main surface and the second raised irregularity of said insulating film extends to a second height above the main surface greater than the first height.

4. A semiconductor device comprising:

a semiconductor substrate having a first conductivity type;

device isolation regions formed on a main surface of said semiconductor substrate;

a tunnel insulating film formed on the main surface of said semiconductor substrate except for said device isolation regions;

a first-layer floating gate formed on said tunnel insulating film;

diffusion regions having a second conductivity type formed at both ends of said first-layer floating gate;

an insulating film formed over said diffusion regions having a second conductivity type and said device isolation regions;

island-like $Si_3N_4$ portions formed on said insulating film;

a second-layer floating gate having a roughened shape and formed on said $Si_3N_4$ portions; and a control gate formed on said second-layer floating gate.

5. The semiconductor device according to claim 1, wherein the first raised irregularity extends to a first height above the main surface and the second raised irregularity extends to a second height above the main surface greater than the first height.

* * * * *

UNITED STATES PATENT AND TRADEMARK OFFICE
CERTIFICATE OF CORRECTION

PATENT NO. : 6,501,125 B2
DATED : December 31, 2002
INVENTOR(S) : Kiyoteru Kobayashi It is certified that error appears in the above-identified patent and that said Letters Patent is hereby corrected as shown below:

<u>Title page, Item [54] and Column 1, lines 1 and 2,</u>
Change "SEMICONDUCTOR DEVICE AND MANUFACTURING METHOD THEREOF" to -- NON-VOLATILE SEMICONDUCTOR DEVICE --

Signed and Sealed this

Twenty-first Day of October, 2003

JAMES E. ROGAN
*Director of the United States Patent and Trademark Office*